United States Patent [19]
Heyl et al.

[11] Patent Number: 5,424,678
[45] Date of Patent: Jun. 13, 1995

[54] MUTING OF COMPUTER SOUND SYSTEM DURING POWER CYCLING

[75] Inventors: Lawrence F. Heyl, Mountain View; Mark C. Gurries; Steven E. Austin, both of San Jose, all of Calif.

[73] Assignee: Apple Computer, Inc., Cupertino, Calif.

[21] Appl. No.: 190,794

[22] Filed: Feb. 2, 1994

[51] Int. Cl.[6] .............................................. H03F 1/14
[52] U.S. Cl. ...................................... 330/51; 381/120
[58] Field of Search ................. 330/51, 149; 381/120, 381/121, 123; 455/194.1, 194.2

[56] References Cited

U.S. PATENT DOCUMENTS 5,142,238  8/1992  White ............................. 330/51 X
5,229,719  7/1993  Tagiri ............................... 330/51

FOREIGN PATENT DOCUMENTS 0106528  4/1989  Japan ........................... 455/194.2

Primary Examiner—Steven J. Mottola
Attorney, Agent, or Firm—Burns, Doane, Swecker & Mathis

[57] ABSTRACT

A technique is provided for substantially reducing clicks and pops caused by power cycling, in particular, the power cycling conservation strategy used in a portable computer. More specifically, an audio amplifier arrangement for a computer, in accordance with one embodiment of the present invention, includes a differential amplifier having a first input terminal, a second input terminal and an output terminal. A sound output connector may be connected to the output terminal through a signal path. First switching circuitry is responsive to a first mute signal for connecting together the first input terminal and the second input terminal through a low-impedance path. As a result, an output signal produced by the differential amplifier is essentially forced to zero. When power is removed from or applied to the differential amplifier, however, its behavior is not entirely predictable, and the output signal produced cannot be guaranteed to remain zero throughout the power-down transition. Therefore, further in accordance with the invention, second switching circuitry is responsive to a second mute signal for substantially interrupting the signal path by switching a high impedance into the signal path. In a preferred embodiment, the first switching circuitry and the second circuitry are realized by MOSFETs which in cascade yield approximately 120 dB of attenuation, inaudible to a user by any standard.

5 Claims, 2 Drawing Sheets

MUTING OF COMPUTER SOUND SYSTEM DURING POWER CYCLING

FIELD OF THE INVENTION

The present invention relates to the muting of computer sound systems during power cycling and is particularly applicable to computers.

STATE OF THE ART

For battery-operated devices such as portable computers and the like, battery life is an important consideration. Considerable attention and engineering design has been devoted to conserving battery energy so as to prolong battery life. One of the ways in which present-day portable computers strive to prolong battery life is by applying power selectively to peripheral circuitry, e.g., I/O devices. This strategy conserves power by removing it from portions of the computer that are not presently needed to complete a current task. One increasingly-sophisticated I/O subsystem in present-day computers is in many cases a computer sound system. In multimedia applications, for example, a computer's sound output system may be expected to deliver sound quality comparable to compact disc players. In other applications, however, the sound system integral to the computer is not required, and it is desirable to remove power from it, causing it to "sleep". Typically, rapid removal or application of power to circuitry used for processing sound information will produce extraneous and annoying sounds, usually characterized as "clicks" and "pops".

One prior art technique that attempts to eliminate clicks and pops resorts to controlling the rate at which power is applied or removed. Such a technique, although helpful, produces its own extraneous noises. Typically, active sound processing circuitry, comprised of active amplifiers and associated circuitry, will behave as if turned off while the power is being applied until a threshold is passed at which the circuitry performs its intended function; the active sound processing circuitry "kicking-in" usually has the effect of producing an audible (and annoying) click or pop.

What is needed then, is a sound system arrangement that allows power to be freely cycled (to prolong battery life) without producing undesirable clicks and pops.

SUMMARY OF THE INVENTION

The present invention, generally speaking, provides a technique for substantially reducing clicks and pops caused by power cycling, in particular the power cycling conservation strategy used in a portable computer. More specifically, an audio amplifier arrangement for a computer, in accordance with one embodiment of the present invention, includes a differential amplifier having a first input signal, a second input signal and an output signal. A sound output connector may be connected to the output signal through a signal path. First switching circuitry is responsive to a first mute signal for connecting together the first input signal and the second input signal through a low-impedance path. As a result, an output signal produced by the differential amplifier is essentially forced to zero. When power is removed from or applied to the differential amplifier, however, its behavior is not entirely predictable, and the output signal produced cannot be guaranteed to remain zero throughout the power-down transition. Therefore, further, in accordance with the invention, second switching circuitry is responsive to a second mute signal for substantially interrupting the signal path by switching a high impedance into the signal path. In a preferred embodiment, the first switching circuitry and the second circuitry are realized by MOSFETs which in cascade yield approximately 120 dB of attenuation, inaudible to a user by any standard.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
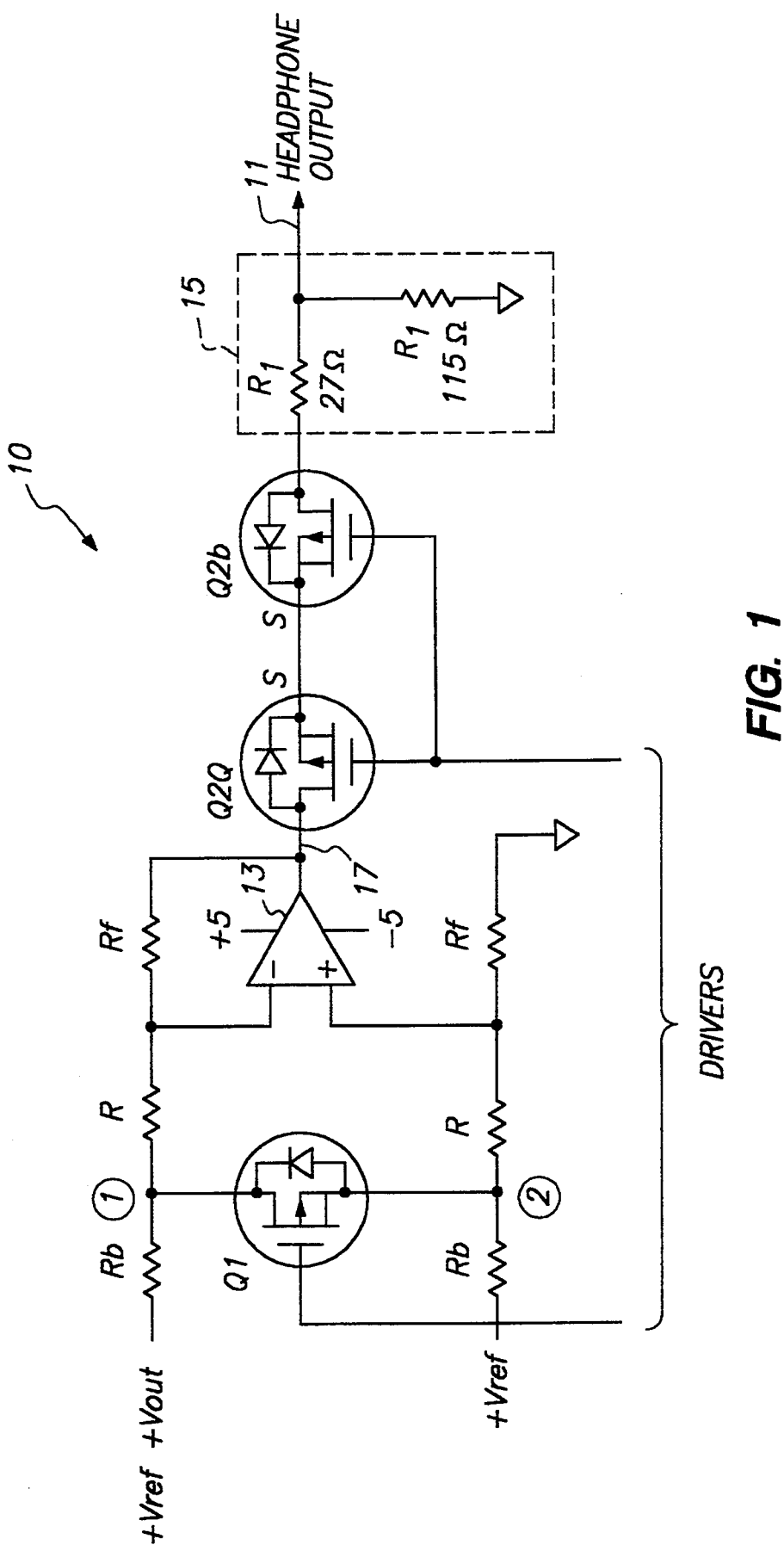
FIG. 1 is a schematic diagram of a single-channel muting circuit in accordance with one embodiment of the present invention.

Referring to FIG. 1, an arrangement is shown to isolate power cycling artifacts from a sound output 11. Only a single sound channel 10 is shown, the arrangement the possible additional channels being essentially identical.

A sound source (not shown) is referred to a quiet bias voltage $+V_{ref}$. The bias voltage and a signal from the sound source, $+V_{ref}+V_{out}$, therefore provide two separate signals. All output signal 11 suitable for driving a sound output (in this instance, a headphone output) is produced using a differential amplifier 13 (for example, TLE2062, available from Texas Instruments) that subtracts the bias voltage from the source signal.

Ignoring for the time being the MOSFETs Q1, Q2a and Q2b, the differential amplifier 13 has associated with each of its inputs input network resistors Rb and R and a feedback network resistor Rf. Normally, the resistors Rb and R would be combined into a single resistor. In an exemplary embodiment, Rb+R=Rf such that the differential amplifier exhibits a differential gain of unity.

The resistor Rf may have a value of about 20 k ohms. A voltage divider network is comprised of resistors $R_1$ and $R_2$ is connected between the output terminal of the differential amplifier and the headphone output 11. In a preferred embodiment, $R_1=27$ ohms and $R_2=115$ ohms so as to present to the headphones a Thevinin equivalent two-volt peak-to-peak open-circuit voltage source having an impedance of 37 ohms. This output arrangement has been found in practice to produce a useful amount of sound when used with most headphones.

Such an arrangement of a differential amplifier can, by itself, create annoying clicks and pops because the amplifier output 17 will feed any glitch, or artifact, of its power-up or power-down behavior to the output 11. In addition, the bias voltage and the source signal will typically slew at different rates, i.e., exhibit different rise and fall time and characteristics upon power-up and power-down. The difference between the signals under these circumstances is amplified and fed to the headphone output 11. If the amplifier inputs are not constrained, the amplifier output 17 may easily swing rail to rail, causing large transients.

To reduce this sort of glitch, which is easily caused by the sound source and the bias slewing at different rates, a MOSFET switch Q1 is situated between the nodes 1 and 2 joining the resistors Rb and R so as to connect together the bias voltage input and source voltage input to the differential amplifier 13. Connecting the inputs to both sides of the differential amplifier together causes them to assume substantially the same value, and the amplifier, which exhibits high common-mode rejection, causes the input signals to cancel out. The values of the resistors Rb and R are chosen so as to strike a balance between the attenuation achieved by the MOSFET Q1 and the gain of the differential amplifier 13. Increasing Rb increases the attenuation achieved by the MOSFET Q1 when it is conducting, while decreasing R increases the gain of the differential amplifier, offsetting the gain in attenuation. In a preferred embodiment Rb=R=10k ohms, such that the MOSFET Q1, which exhibits an ON resistance of about 10 ohms, achieves an attenuation of 1000:1 and the differential amplifier exhibits a gain of two with respect to the voltage signal appearing between the nodes 1 and 2. The effective attenuation is therefore 500:1.

The amplifier input network resistor values R and $R_b$ also are chosen to limit the voltage across the MOSFET Q1 to no more than about 200 mV so as to prevent conduction of the MOSFET intrinsic diode during peak signal conditions in normal operation. Alternatively, two source-connected MOSFETs may be used to prevent construction of the MOSFETs intrinsic diodes in a manner described below. Using a typical MOSFET connected between nodes 1 and 2, an attenuation of 40 dB may be achieved.

The MOSFET Q1 by itself, however, does not provide a complete solution to the problem of clicks and pops. When power is removed from or applied to the differential amplifier, its behavior is not entirely predictable, and the output signal produced cannot be guaranteed to remain zero throughout the power transition. Therefore, further in accordance with the invention, a pair of MOSFETs Q2a and Q2b is connected in series between the differential amplifier output 17 and the headphone output 11. A pair of devices is needed because of the intrinsic diode within the device, which can become forward biased and conduct noise to the headphone output 11. By using a pair of devices, source-connected with the drain electrodes serving as input and output, the intrinsic diodes are caused to be reverse biased whatever the polarity of the input signal thus, essentially eliminating them from the circuit. The MOSFETs Q2a and Q2b may be operated into a relatively low impedance load (R2=115 ohms) to achieve an adjustment in output level, previously described, as well as a high attenuation ratio. The MOSFETs Q2a and Q2b when off exhibit a resistance measured in megohms, therefore achieving very high attenuation in relation to the low impedance load. Typical MOSFETs configured as described achieve an output attenuation of 80 dB.

Although the pair of MOSFETs Q2a and Q2b attenuate the output of the differential amplifier, note that the pair of MOSFETs by itself does not afford a complete solution to the problem of clicks and pops. As described previously, if the amplifier inputs are not constrained, it is easy for the amplifier output to swing rail to rail, causing large transients that may be audible even through the pair of MOSFETs. This sort of glitch is reduced by the MOSFET Q1, which is situated to connect the bias voltage and the source voltage together. In cascade, the MOSFET Q1 and the output MOSFET pair Q2a and Q2b achieve 120 dB of attenuation, inaudible by any standard.

The gate voltages of the two MOSFET switches are Q2a and Q2b controlled so that the system is normally muted, i.e., no signal is fed to the output. Muting is accomplished by having the output MOSFET pair Q2a and Q2b not conduct at the same time as the input MOSFET Q1 is conducting. In this state, power may be freely applied or removed to the sound circuitry without audible artifacts. To maintain muting, the only driving potential required is for the MOSFET gates. The MOSFET gates require only nano Ampere currents, which may be considered negligible.

To produce desired audible sounds, power is applied to both the sound source circuitry and the output differential amplifier 13. After these circuits have settled, the driving arrangement for the MOSFET switches causes the output pair of MOSFETs Q2a and Q2b to conduct and the input MOSFET switch Q1 to not conduct. Because of the high impedance of the input MOSFET Q1, it has no effect oil the circuit. At the same time, the output MOSFET pair Q2a and Q2b provides a low impedance signal path to the output 11.

To mute the output 11, the driving arrangement is driven to isolate the output, after which power may be removed from the sound source and the differential amplifier 13.

Figure 2:
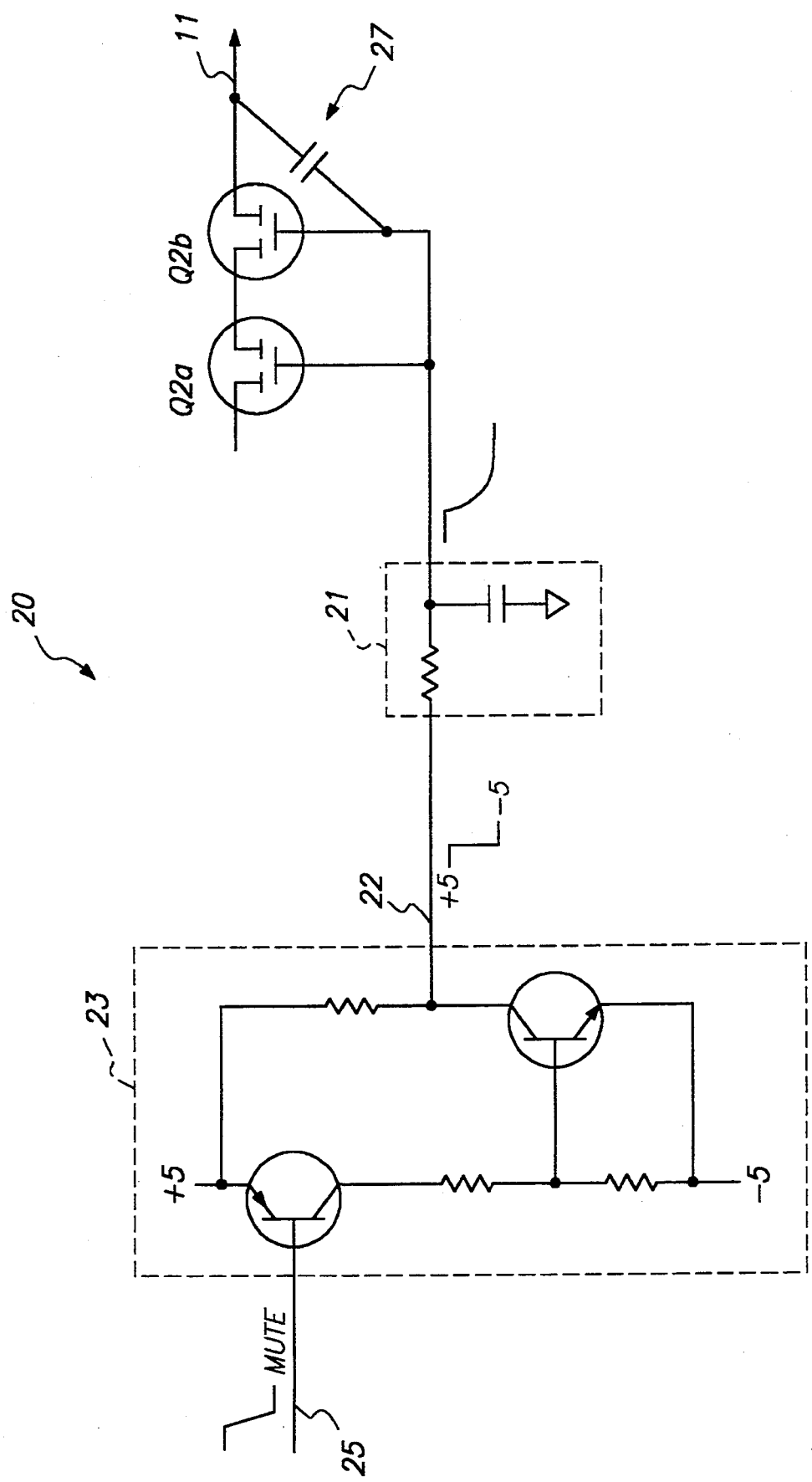
FIG. 2 is a schematic diagram of a muting signal driver for use in the muting circuit of FIG. 1.

Referring to FIG. 2, in a preferred embodiment, a driving, arrangement 20 for the MOSFET pair Q2a and Q2b uses a single RC section 21, with a typical time constant of 20 to 50 ms, to smooth a control signal 22. This precaution reduces the possibility of the edge of the mute control signal being capacitively coupled, through stray capacitance 27, to the headphone output 11 in a manner that might be audible. The channel resistance of MOSFETs Q2a and Q2b, although not linear with gate voltage, varies continuously, so that a suitable smooth transition occurs in tire circuit in a manner not prone to generate an audible click. A level shifter 23 performs level shifting of a CMOS muting signal 25 from a CMOS level to a ten volts peak-to-peak level of the control signal 22. A complementary driving circuit in which the muting signal 25 is inverted is used to drive the MOSFET Q1. Alternatively, the MOSFET Q1 may be of a complementary type, N or P, as compared to the pair of MOSFETs Q2a and Q2b, in which case the driving circuit of FIG. 2 may be used to drive all of the MOSFETs.

An alternative arrangement may be to use separate MOSFETs to isolate the inputs of the differential amplifier 13 from their respective input signals. The preferred embodiment of the invention, however, using a single MOSFET across the inputs of the differential amplifier, achieves a cost savings that, in volume production, becomes appreciable. Cost savings may also be achieved by, where a large voltage swing is available for controlling the MOSFETs (as in FIG. 2), choosing less-expensive MOSFETs (for example, Siliconix TP0202) having a relatively high threshold voltage. The present invention therefore provides a simple, inexpensive, yet very effective solution to the problem of clicks and pops in sound systems in which power is cycled to achieve power savings.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An audio amplifier arrangement for a computer, comprising:

a differential amplifier having a first input terminal operatively connected to a first input signal, a second input terminal operatively connected to a second input signal, said first and second input terminals together providing to said differential amplifier a differential input signal equal to the algebraic difference between a signal applied to the first input terminal and a signal applied to the second input terminal, and having an output terminal producing an output signal proportional to said differential input signal; and means, responsive to a first mute signal, for setting said differential input signal to a sufficiently small value as to prevent the differential amplifier from producing an output signal of audible level, said means for setting comprising first switching means, responsive to said first mute signal, for connecting together said first input signal and said second input signal through a low-impedance path.

2. The apparatus of claim 1, further comprising:

a sound output connector connected to said output signal through a signal path; and second switching means responsive to a second mute signal for substantially interrupting said signal path by switching a high impedance into said signal path.

3. The apparatus of claim 2, wherein said first switching means comprises a MOSFET.

4. The apparatus of claim 2, wherein said second switching means comprises a pair of source-connected MOSFETs.

5. The apparatus of claim 2, further comprising driving means for generating said second muting signal, said driving means comprising an RC filter stage.

* * * * *